US008987663B2

(12) United States Patent
Gordon et al.

(10) Patent No.: US 8,987,663 B2
(45) Date of Patent: Mar. 24, 2015

(54) ION INLET FOR A MASS SPECTROMETER

(75) Inventors: David Gordon, Manchester (GB); Daniel James Kenny, Knutsford (GB); Steven Derek Pringle, Darwen (GB)

(73) Assignee: Micromass UK Limited, Wilmslow (GB)

( * ) Notice: Subject to any disclaimer, the term of this patent is extended or adjusted under 35 U.S.C. 154(b) by 0 days.

(21) Appl. No.: 14/123,566

(22) PCT Filed: Jun. 1, 2012

(86) PCT No.: PCT/GB2012/051261

§ 371 (c)(1), (2), (4) Date: Mar. 19, 2014

(87) PCT Pub. No.: WO2012/164314

PCT Pub. Date: Dec. 6, 2012

(65) Prior Publication Data

US 2014/0306103 A1 Oct. 16, 2014

Related U.S. Application Data

(60) Provisional application No. 61/497,325, filed on Jun. 15, 2011.

(30) Foreign Application Priority Data

Jun. 3, 2011 (GB) .................................. 1109384.6

(51) Int. Cl.

*H01J 49/00* (2006.01)
*H01J 49/26* (2006.01)
*H01J 37/301* (2006.01)
*B01D 59/44* (2006.01)
*H01J 49/04* (2006.01)
*H01J 49/06* (2006.01)
*H01J 49/24* (2006.01)

(52) U.S. Cl.

CPC ............... *H01J 49/04* (2013.01); *H01J 49/067* (2013.01); *H01J 49/24* (2013.01)

USPC ............ 250/288; 250/281; 250/282; 250/289

(58) Field of Classification Search

CPC ..... H01J 49/0422; H01J 49/04; H01J 49/067; H01J 49/29

USPC .................................. 250/281, 282, 288, 289

See application file for complete search history.

(56) References Cited

U.S. PATENT DOCUMENTS

| | | | | |
|---|---|---|---|---|
| 5,485,016 | A * | 1/1996 | Irie et al. | 250/288 |
| 6,707,036 | B2 | 3/2004 | Makarov et al. | |
| 6,707,040 | B2 | 3/2004 | Makarov et al. | |
| 7,091,477 | B2 * | 8/2006 | Jolliffe et al. | 250/282 |
| 7,164,124 | B2 | 1/2007 | Takada et al. | |
| 7,329,863 | B2 * | 2/2008 | Kalinitchenko | 250/288 |
| 7,687,771 | B2 | 3/2010 | Jolliffe et al. | |
| 7,741,600 | B2 | 6/2010 | Wouters et al. | |
| 7,863,558 | B2 | 1/2011 | Schneider et al. | |
| 8,642,949 | B2 * | 2/2014 | Makarov et al. | 250/283 |

* cited by examiner

*Primary Examiner* — Nikita Wells

(74) *Attorney, Agent, or Firm* — Diederiks & Whitelaw, PLC

(57) ABSTRACT

An ion inlet for a mass spectrometer is disclosed comprising a housing having a sampling orifice and an atmospheric pressure orifice. One or more gas outlets are provided in the housing. Gas is drawn through the sampling orifice by a pump so that the gas exits via the one or more gas outlets.

40 Claims, 5 Drawing Sheets

ION INLET FOR A MASS SPECTROMETER

CROSS REFERENCE TO RELATED APPLICATIONS

This application is the National Stage of International Application No. PCT/GB2012/051261, filed 1 Jun. 2012, which claims priority from and the benefit of U.S. Provisional Patent Application Ser. No. 61/497,325 filed on 15 Jun. 2011 and United Kingdom Patent Application No. 1109384.6 filed on 3 Jun. 2011. The entire contents of these applications are incorporated herein by reference.

BACKGROUND OF THE INVENTION

The present invention relates to an ion inlet for a mass spectrometer. The preferred embodiment relates to apparatus and methods for improving the sampling efficiency of ions in mass spectrometers.

Mass spectrometers often contain different regions or chambers which are at different levels of vacuum. For example, an instrument may have a quadrupole mass filter which resides in a chamber at a pressure of approx. $1\times10^{-5}$ mbar and which is followed by a collision cell at a pressure of approx. $1\times10^{-3}$ to $1\times10^{-2}$ mbar. The collision cell may, in turn, be followed by a Time of Flight mass analyser operating at a pressure of $<1\times10^{-6}$ mbar. These pressures are often achieved by the use of one or more roughing pumps and one or more turbomolecular pumps. Typically, the roughing pump provides the pumping for the source inlet as well as backing the turbomolecular pump(s).

Mass spectrometers can be used with various different source inlet types. The ions are often formed and introduced into the mass spectrometer at atmospheric pressure via a sampling orifice which is located close to the point of ionisation.

The total gas load on the mass spectrometer is defined by the atmospheric pressure orifice. In order to capture the maximum number of ions and therefore maximise the sensitivity of the mass spectrometer, the atmospheric pressure orifice is often located as close as possible to the point of ion formation. In most cases, the atmospheric pressure orifice and the sampling orifice are the same item. These orifices are generally manufactured to be as thin as possible, typically 0.1 mm to 0.5 mm (although thinner and thicker are both known), so as to minimise loss of ion transmission as ions pass through the orifice. The thicker the orifice the more likely it is that some ions will strike the walls of the orifice as they pass through and be lost.

Reducing the size of an orifice (i.e. reducing the diameter of a circular hole or increasing the length of a tube) reduces the gas flow through it, which in turn reduces the quantity of vacuum pumping required to achieve the pressures as described above. However, in the case where the sampling orifice and the atmospheric pressure orifice are the same item, reducing the size of the orifice reduces the volume over which the orifice can sample effectively i.e. ions must pass close to the sampling orifice in order to be drawn in to and through the orifice. Therefore, reducing this orifice size can lead to a significant decrease in the number of ions sampled which reduces the sensitivity of the mass spectrometer. In addition, a smaller diameter orifice is more likely to suffer from a loss of sensitivity over time as contaminants build up on the orifice surface.

It is known that curtain gas can be used to improve the robustness of a sampling orifice. However, the use of a curtain gas often reduces the abundance of ions in the volume in front of the sampling orifice and therefore reduces sensitivity. This is particularly evident as the size of the sampling orifice is reduced.

It is known to have a small atmospheric pressure orifice spatially removed from the ion and gas flow and have a larger sampling orifice in order to improve the long term robustness of the mass spectrometer. However, the total gas flow into the ion sampling orifice is determined by the gas flow into the smaller atmospheric pressure orifice. Due to the larger diameter of the ion sampling orifice, the gas flow velocity into the ion sampling orifice is much lower than at the atmospheric pressure orifice. Therefore, the ability of the atmospheric pressure orifice to capture ions from a high velocity gas flow is reduced.

In addition, in some cases the point of ion formation cannot be located close to the mass spectrometer and so ions must be transferred to the sampling region of the mass spectrometer in order to maximise the ion capture efficiency.

It is desired to provide an improved mass spectrometer and method of mass spectrometry.

SUMMARY OF THE INVENTION

According to an aspect of the present invention there is provided an inlet for a mass spectrometer comprising:

a housing comprising: (i) a sampling orifice; (ii) an atmospheric pressure orifice; and (iii) one or more gas outlets;

wherein, in use gas is drawn into the housing via the sampling orifice and at least some of the gas is caused to exit the housing via the one or more gas outlets without passing through the atmospheric pressure orifice.

The sampling orifice is preferably non-gas limiting.

According to an embodiment the sampling orifice preferably has a diameter or width selected from the group consisting of (i) 0.1-1.0 mm; (ii) 1.0-2.0 mm; (iii) 2.0-3.0 mm; (iv) 3.0-4.0 mm; (v) 4.0-5.0 mm; (vi) 5.0-6.0 mm; (vii) 6.0-7.0 mm; (viii) 7.0-8.0 mm; (ix) 8.0-9.0; and (x) 9.0-10.0 mm.

The sampling orifice preferably has a cross-sectional area selected from the group consisting of: (i) 0.007-1 $mm^2$; (ii) 1-10 $mm^2$; (iii) 10-20 $mm^2$; (iv) 20-30 $mm^2$; (v) 30-40 $mm^2$; (vi) 40-50 $mm^2$; (vii) 50-60 $mm^2$; (viii) 60-70 $mm^2$; (ix) 70-80 $mm^2$; (x) 80-90 $mm^2$; and (xi) 90-100 $mm^2$.

The atmospheric pressure orifice is preferably gas limiting.

The atmospheric pressure orifice preferably has a diameter or width selected from the group consisting of (i) 0.05-0.5 mm; (ii) 0.5-1.0 mm; (iii) 1.0-1.5 mm; (iv) 1.5-2.0 mm (v) 2.0-2.5 mm; and (vi) 2.5-3.0 mm.

The atmospheric pressure orifice preferably has a cross-sectional area selected from the group consisting of: (i) 0.001-1 $mm^2$; (ii) 1-2 $mm^2$; (iii) 2-3 $mm^2$; (iv) 3-4 $mm^2$; (v) 4-5 $mm^2$; (vi) 5-6 $mm^2$; (vii) 6-7 $mm^2$; (viii) 7-8 $mm^2$; (ix) 8-9 $mm^2$; and (x) 9-10 $mm^2$, The one or more gas outlets preferably comprise one or more apertures in the housing adjacent the atmospheric pressure orifice.

The housing preferably comprises a first cone or inner portion. According to an embodiment the sampling orifice may be provided in the first cone or inner portion. The one or more gas outlets are preferably provided in the first cone or inner portion.

The housing preferably further comprises a second cone or outer portion which preferably surrounds the first cone or inner portion, wherein an annular volume is formed between the first cone or inner portion and the second cone or outer portion.

The inlet may further comprises an o-ring, seal or gas flow restriction located in the annular volume.

The o-ring, seal or gas flow restriction is preferably arranged and adapted so that gas drawn into the inlet is drawn primarily towards the atmospheric pressure orifice The o-ring, seal or gas flow restriction is preferably arranged and adapted so that gas exiting the housing exits primarily through one or more gas outlets provided in the second cone or outer portion.

The o-ring, seal or gas flow restriction is preferably arranged and adapted to prevent or restrict gas flow between a portion of the annular volume and the sampling orifice.

The sampling orifice may be provided in the second cone or outer portion.

The one or more gas outlets are preferably provided in the second cone or outer portion.

One or more gas outlets in the first cone or inner portion are preferably in gaseous communication with one or more gas outlets in the second cone or outer portion.

According to an embodiment gas is drawn: (i) into the first cone or inner portion; then (ii) out of the first cone or inner portion via one or more gas outlets provided in the first cone or inner portion; then (iii) out of an annular volume between the first cone or inner portion and the second cone or outer portion via one or more gas outlets provided in the second cone or outer portion.

According to an embodiment the first cone or inner portion and/or the second cone or outer portion further comprise one or more cylindrical tubes or extension members.

According to an embodiment a cross-sectional area of the one or more cylindrical tubes or extension members varies along the length of the one or more cylindrical tubes or extension members.

The cross-sectional area of the one or more cylindrical tubes or extension members preferably increases along the length of the one or more cylindrical tubes or extension members from the sampling orifice towards the atmospheric pressure orifice.

According to an embodiment the inlet may further comprise an ion source housed within the one or more cylindrical tubes or extension members.

The ion source preferably comprises a Glow Discharge ion source or a corona pin.

According to an embodiment the ion source may comprise an Atmospheric Pressure Chemical Ionisation ion source.

Gas is preferably drawn into the one or more cylindrical tubes or extension members and out of an annular volume between the first cone or inner portion and the second cone or outer portion via one or more gas outlets provided in the second cone or outer portion.

According to an embodiment a heating device is preferably arranged and adapted either: (i) to heat the first cone or inner portion; and/or (ii) to heat the second cone or outer portion; and/or (iii) to heat the one or more cylindrical tubes or extension members.

According to an embodiment either: (i) ions generated by an ion source are arranged to enter the housing via the sampling orifice; and/or (ii) ions generated by an on source are arranged to pass through the atmospheric pressure orifice. The inlet preferably comprises an ion inlet for sampling ions into a mass spectrometer.

An axis through the sampling orifice is preferably substantially coaxial or otherwise parallel with an axis through the atmospheric pressure orifice.

The sampling orifice preferably has a larger cross-sectional area than the atmospheric pressure orifice.

According to an aspect of the present invention there is provided apparatus comprising:

an inlet as described above; and a first device arranged and adapted to draw gas into the housing via the sampling orifice and to cause at least some of the gas to exit the housing via the one or more gas outlets without passing through the atmospheric pressure orifice.

The first device preferably comprises one or more pumps.

The first device preferably comprises a venturi or diaphragm pump.

According to an aspect of the present invention there is provided a mass spectrometer comprising an inlet as described above.

According to an aspect of the present invention there is provided a mass spectrometer comprising apparatus as described above.

The mass spectrometer preferably further comprises a vacuum chamber wherein, in use, ions pass through the atmospheric pressure orifice into the vacuum chamber.

The mass spectrometer preferably further comprises an ion source for generating ions.

The ion source is preferably located upstream of the sampling orifice.

The mass spectrometer preferably further comprises a recycling device for recycling gas molecules which have exited the housing via the one or more gas outlets back towards the ion source for subsequent ionisation of the gas molecules.

The mass spectrometer preferably further comprises a device for maintaining a potential difference between at least a first portion of the housing and a second different portion of the housing either adjacent to and/or which defines the atmospheric pressure orifice so that ions are accelerated towards the atmospheric pressure orifice.

According to an aspect of the present invention there is provided a method of mass spectrometry comprising:

drawing gas via a sampling orifice into an inlet having a housing so that at least some of the gas exits the housing via one or more gas outlets without passing through an atmospheric pressure orifice.

According to an aspect of the present invention there is provided an inlet for a mass spectrometer comprising:

a housing comprising: (i) a non-gas limiting sampling orifice; (ii) a sub-atmospheric pressure orifice; and (iii) one or more gas outlets;

wherein, in use, gas is drawn into the housing via the sampling orifice and at least some of the gas exits the housing via the one or more gas outlets without passing through the sub-atmospheric pressure orifice.

According to an aspect of the present invention there is provided a method of mass spectrometry comprising:

drawing gas via a non-gas limiting sampling orifice into an inlet having a housing so that at least some of the gas exits the housing via the one or more gas outlets without passing through a sub-atmospheric pressure orifice.

According to an aspect of the present invention there is provided a mass spectrometer comprising:

a high pressure region and a low pressure region which are interconnected by an orifice;

a first housing arranged in the high pressure region and around the orifice, wherein the housing has an inlet opening in communication with the orifice such that components from a sample to be analysed may enter the housing from the high pressure region and then pass through the orifice into the low pressure region, and wherein the housing has an outlet opening in communication with the orifice; and means to draw gas from the high pressure region in through the inlet opening, towards the orifice and out of the outlet opening.

According to an aspect of the present invention there is provided a method of mass spectrometry comprising:

providing a high pressure region and a low pressure region which are interconnected by an orifice;

providing a first housing arranged in the high pressure region and around the orifice, wherein the housing has an inlet opening in communication with the orifice such that components from a sample to be analysed enter the housing from the high pressure region and then pass through the orifice into the low pressure region, and wherein the housing has an outlet opening in communication with the orifice; and drawing gas from the high pressure region in through the inlet opening, towards the orifice and out of the outlet opening.

The components preferably comprise ions or molecules which enter the housing and are ionised before passing through the orifice.

The mass spectrometer preferably further comprises means for providing ions or molecules to the high pressure region or means for generating ions in the high pressure region.

According to an embodiment the high pressure region forms at least part of an ion source, According to an embodiment the means to draw gas draws the gas adjacent to and past the orifice and then out of the outlet opening.

The means to draw gas preferably draws gas containing the components from the high pressure region.

According to the preferred embodiment the axis through the inlet opening is, coaxial or otherwise parallel with the axis through the orifice.

The low pressure region preferably comprises a vacuum chamber of the mass spectrometer and the housing is preferably located outside of the vacuum chamber.

The inlet opening preferably has a larger cross-sectional area than the orifice.

According to the preferred embodiment the orifice is preferably the smallest of any openings between the high pressure region and the low pressure region so as to be the opening which determines the gas flow rate between the high and low pressure regions.

The high pressure region is preferably substantially at atmospheric pressure.

According to the preferred embodiment the orifice comprises an atmospheric pressure orifice.

The housing preferably comprises a first gas conduit extending from the inlet opening to the orifice and at least one second gas conduit extending from the orifice to the outlet opening, such that gas can be drawn in the inlet opening, over the orifice and out of the outlet opening.

The axis of the at least one first gas conduit is preferably substantially perpendicular to the axis of the second conduit.

The axis through the orifice is preferably substantially perpendicular to the axis through the exit opening.

The inlet opening is preferably located a distance upstream of the orifice.

The inlet opening preferably comprises a sampling orifice.

According to an embodiment the inlet opening is substantially coincident with the orifice and surrounds the orifice.

The orifice preferably comprises a sampling orifice.

According to an embodiment the orifice is formed in a skimmer cone.

According to an embodiment the orifice is formed in a wall of a vacuum chamber.

The wall preferably has a portion of reduced thickness and the orifice is preferably formed in this portion.

According to a preferred embodiment the housing is or comprises a cone.

The mass spectrometer preferably further comprises a second housing surrounding the first housing and providing a gas conduit therebetween, wherein the second housing has an inlet opening and an outlet opening in communication with the gas conduit between the two housings, wherein the inlet openings of the first and second housings are in communication and the outlet openings of the first and second housings are in communication, and wherein the housings and means to draw gas are configured such that gas is drawn from the high pressure region into the inlet opening of the first housing towards the orifice, out of the outlet opening in the first housing and then out of the outlet opening in the second housing; and wherein gas is drawn from the high pressure region into the inlet opening of the second housing, through the conduit between the housings and out of the outlet opening in the second housing.

The outlet opening in the first housing preferably has a different cross-sectional area to the outlet opening in the second housing.

The outlet opening in the first housing preferably has a smaller cross-sectional area than the outlet opening in the second housing.

The second outer housing preferably is or comprises a cone.

The second housing preferably extends a distance upstream of the first housing and such that the inlet opening in the second housing is a distance upstream of the inlet opening in the first housing.

The first housing preferably extends a distance upstream of the orifice and such that the inlet opening in the first housing is a distance upstream of the orifice.

The first and/or second housing is preferably heated so as to heat gas passing therethrough.

The first and/or second housing preferably includes an ionisation means for ionising the components and which is arranged between the respective inlet opening and the orifice.

The cross-sectional area of the conduit through the first and/or second housing preferably increases in a direction from its respective inlet opening to the orifice.

The mass spectrometer preferably further comprises means for recycling gas which has been drawn through the exit openings in the first and/or second housings back into the inlet opening in the first and/or second housing.

According to an embodiment the orifice may be formed in an electrode and/or at least portions of the first and/or second housings are electrodes.

According to an embodiment a potential difference is preferably applied between the electrodes such that ions pass from the first and/or second housings through the orifice and into the low pressure region.

The preferred embodiment of the present invention increases the efficiency of the ion capture from a small atmospheric pressure orifice. As the orifice can be made smaller, whilst maintaining sampling efficiency, this reduces the vacuum requirements and therefore enables the use of a small lightweight and portable mass spectrometer. A further feature of the preferred embodiment is to increase the efficiency of the capture and sampling of ions formed at a distance from the orifice.

According to an embodiment the mass spectrometer may further comprise:

(a) an ion source selected from the group consisting of (i) an Electrospray ionisation ("ESI") ion source; (ii) an Atmospheric Pressure Photo Ionisation ("APPI") ion source; (iii) an Atmospheric Pressure Chemical ionisation ("APCI") ion source; (iv) a Matrix Assisted Laser Desorption Ionisation ("MALDI") ion source; (v) a Laser Desorption Ionisation ("LDI") on source; (vi) an Atmospheric Pressure Ionisation ("API") ion source; (vii) a Desorption Ionisation on Silicon ("DIOS") ion source; (viii) an Electron impact ("EI") ion source; (Ix) a Chemical Ionisation ("CI") ion source; (x) a Field Ionisation ("FI") ion source; (xi) a Field Desorption ("FD") ion source; (xii) an Inductively Coupled Plasma ("ICP") ion source; (xiii) a Fast Atom Bombardment ("FAB") ion source; (xiv) a Liquid Secondary Ion Mass Spectrometry ("LSIMS") ion source; (xv) a Desorption Electrospray Ionisation ("DESI") ion source; (xvi) a Nickel-63 radioactive ion source; (xvii) an Atmospheric Pressure Matrix Assisted Laser Desorption Ionisation ion source; (xviii) a Thermospray ion source; (xix) an Atmospheric Sampling Glow Discharge Ionisation ("ASGDI") ion source; and (xx) a Glow Discharge ("GD") ion source; and/or (b) one or more continuous or pulsed ion sources; and/or (c) one or more ion guides; and/or (d) one or more ion mobility separation devices and/or one or more Field Asymmetric on Mobility Spectrometer devices; and/or (e) one or more ion traps or one or more ion trapping regions; and/or (f) one or more collision, fragmentation or reaction cells selected from the group consisting of: (I) a Collisional induced Dissociation ("CID") fragmentation device; (ii) a Surface Induced Dissociation ("SID") fragmentation device; (iii) an Electron Transfer Dissociation ("ETD") fragmentation device; (iv) an Electron Capture Dissociation ("ECD") fragmentation device; (v) an Electron Collision or Impact Dissociation fragmentation device; (vi) a Photo Induced Dissociation ("ND") fragmentation device; (vii) a Laser Induced Dissociation fragmentation device; (viii) an infrared radiation induced dissociation device; (ix) an ultraviolet radiation induced dissociation device; (x) a nozzle-skimmer interface fragmentation device; (xi) an in-source fragmentation device; (xii) an in-source Collision Induced Dissociation fragmentation device; (xiii) a thermal or temperature source fragmentation device; (xiv) an electric field induced fragmentation device; (xv) a magnetic field induced fragmentation device; (xvi) an enzyme digestion or enzyme degradation fragmentation device: (xvii) an ion-ion reaction fragmentation device; (xviii) an ion-molecule reaction fragmentation device; (xix) an ion-atom reaction fragmentation device; (xx) an ion-metastable ion reaction fragmentation device; (xxi) an ion-metastable molecule reaction fragmentation device; (xxii) an ion-metastable atom reaction fragmentation device; (xxiii) an ion-ion reaction device for reacting ions to form adduct or product ions; (xxiv) an ion-molecule reaction device for reacting ions to form adduct or product ions; (xxv) an ion-atom reaction device for reacting ions to form adduct or product ions; (xxvi) an ion-metastable ion reaction device for reacting ions to form adduct or product ions: (xxvii) an ion-metastable molecule reaction device for reacting ions to form adduct or product ions; (xxviii) an ion-metastable atom reaction device for reacting ions to form adduct or product ions; and (xxix) an Electron Ionisation Dissociation ("EID") fragmentation device; and/or (g) a mass analyser selected from the group consisting of: (i) a quadrupole mass analyser; (ii) a 2D or linear quadrupole mass analyser; (iii) a Paul or 3D quadrupole mass analyser; (iv) a Penning trap mass analyser; (v) an ion trap mass analyser; (vi) a magnetic sector mass analyser; (vii) Ion Cyclotron Resonance ("ICR") mass analyser; (viii) a Fourier Transform Ion Cyclotron Resonance ("FTICR") mass analyser; (ix) an electrostatic or orbitrap mass analyser; (x) a Fourier Transform electrostatic or orbitrap mass analyser; (xi) a Fourier Transform mass analyser; (xii) a Time of Flight mass analyser; (xiii) an orthogonal acceleration Time of Flight mass analyser; and (xiv) a linear acceleration Time of Flight mass analyser; and/or (h) one or more energy analysers or electrostatic energy analysers; and/or (i) one or more ion detectors; and/or (j) one or more mass filters selected from the group consisting of: (i) a quadrupole mass filter (ii) a 2D or linear quadrupole ion trap; (iii) a Paul or 3D quadrupole ion trap; (iv) a Penning ion trap; (v) an ion trap; (vi) a magnetic sector mass filter (vii) a Time of Flight mass filter; and (viii) a Wein filter; and/or (k) a device or ion gate for pulsing ions; and/or (l) a device for converting a substantially continuous ion beam into a pulsed ion beam.

The mass spectrometer may further comprise either:

(i) a C-trap and an Orbitrap® mass analyser comprising an outer barrel-like electrode and a coaxial inner spindle-like electrode, wherein in a first mode of operation ions are transmitted to the C-trap and are then injected into the Orbitrap® mass analyser and wherein in a second mode of operation ions are transmitted to the C-trap and then to a collision cell or Electron Transfer Dissociation device wherein at least some ions are fragmented into fragment ions, and wherein the fragment ions are then transmitted to the C-trap before being injected into the Orbitrap® mass analyser; and/or (ii) a stacked ring ion guide comprising a plurality of electrodes each having an aperture through which ions are transmitted in use and wherein the spacing of the electrodes increases along the length of the ion path, and wherein the apertures in the electrodes in an upstream section of the ion guide have a first diameter and wherein the apertures in the electrodes in a downstream section of the ion guide have a second diameter which is smaller than the first diameter, and wherein opposite phases of an AC or RF voltage are applied, in use, to successive electrodes.

BRIEF DESCRIPTION OF THE DRAWINGS

Various embodiments of the present invention will now be described, by way of example only, and with reference to the accompanying drawings in which.

DETAILED DESCRIPTION OF PREFERRED EMBODIMENT

Various known ion inlets will first be discussed with reference to FIGS. 1A-1D.

Figure 1A:
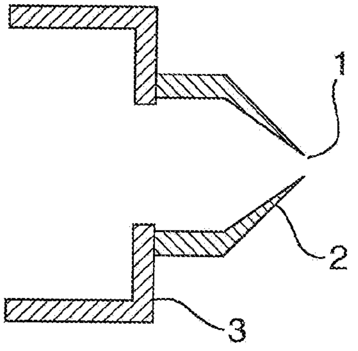
FIG. 1A shows a cross section showing a conventional atmospheric pressure and sampling orifice.
Figure 1B:
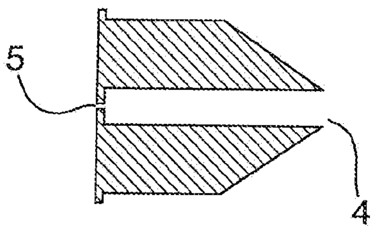
FIG. 1B shows a known arrangement comprising a sampling orifice and a separate atmospheric pressure orifice.
Figure 1C:
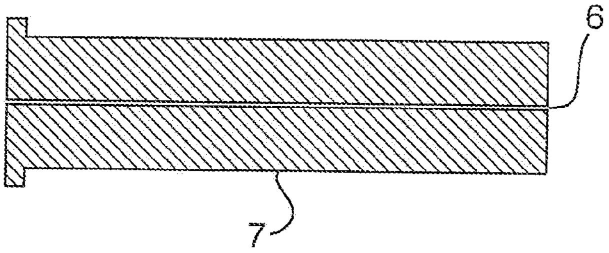
FIG. 1C shows a known arrangement comprising a capillary have an atmospheric pressure and sampling orifice and FIG. 1D shows a known skimmer arrangement wherein a curtain gas is supplied to the skimmer.
Figure 1D:
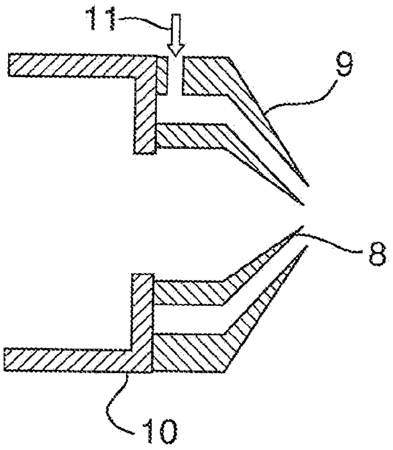

FIG. 1A shows a cross section showing a conventional atmospheric pressure and sampling orifice 1 formed in a skimmer 2 which is attached to a vacuum housing 3 of a mass spectrometer. FIG. 18 shows a known inlet comprising a sampling orifice 4 and a separate downstream atmospheric pressure orifice 5. FIG. 1C shows a known inlet comprising a capillary 7 having an atmospheric pressure and sampling orifice 6. FIG. 1D shows another known arrangement comprising a skimmer 8 having an outer cone 9. The skimmer 8 and outer cone 9 are attached to a vacuum housing 10. A curtain gas is supplied to an annular volume between the outer cone 9 and the skimmer 8.

The conductance of the known apertures as shown in FIGS. 1A-1D and hence the volume the apertures are able to sample ions and gas from is dependent upon their radius/diameter as well as their depth/thickness.

Various improved ion inlet orifices according to preferred embodiments of the present invention will now be described. The sampling cone geometries according to the preferred embodiment have been modified to increase their ion capture efficiency without increasing the gas load on the vacuum system.

Figure 2A:
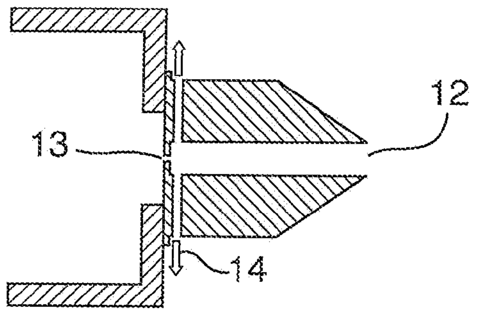
FIG. 2A shows an embodiment of the present invention wherein an inlet is provided comprising a housing having a sampling orifice and a separate atmospheric pressure orifice wherein a gas outlet is provided in the housing adjacent the atmospheric pressure orifice.
Figure 2B:
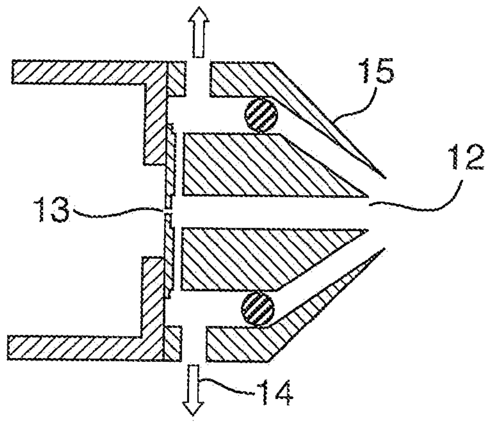
FIG. 2B shows an embodiment of the present invention wherein an outer housing surrounds the inner housing and gas outlets are provided in both the inner and outer housings and FIG. 2C shows an embodiment of the present invention comprising a skimmer cone having an atmospheric pressure and sampling orifice and wherein a gas outlet is provided in the skimmer cone.

FIG. 2A shows an on net according to a preferred embodiment of the present invention. The on inlet comprises a housing having a sampling orifice 12 and a separate downstream atmospheric pressure orifice 13. The housing surrounds the atmospheric pressure orifice 13 and one or more gas outlets or channels are provided in the housing. Additional pumping 14 is provided to the sampling orifice 12 via the gas outlets or channels. As a result, gas is drawn into the housing via the sampling orifice 12 and then exits the housing via the gas outlets or channels without passing through the atmospheric pressure orifice 13. The additional pumping 14 increases the gas velocity at the sampling orifice 12 and therefore increases the abundance of ions at the atmospheric pressure orifice 13, FIG. 2B shows another embodiment of the present invention which is similar to the embodiment shown and described above with reference to FIG. 2A but which further comprises a second (outer) housing which substantially encloses the (first) housing. The first (inner) and second outer housings in combination provide an altered pumping arrangement.

The amount of pumping of the sampling orifice 12 (i.e. the inlet opening of the first or inner housing) compared to the outer cone 15 (i.e. second housing) is preferably determined by the relative cross-sectional area between the outer cone 15 and the skimmer cone (i.e. first or inner housing) and the size of the pumping holes or apertures in the skimmer cone. This allows a greater amount of pumping to be used thus increasing the capture volume of the sampling orifice 12.

An o-ring, seal or gas flow restriction device is preferably located in the annular volume between the first or inner housing (i.e. the skimmer cone) and the outer cone 15 (i.e. second housing). The o-ring, seal or gas flow restriction device preferably prevents all the gas going around the outside of the inner cone so that instead the gas is directed towards the atmospheric pressure orifice 13.

Figure 2C:
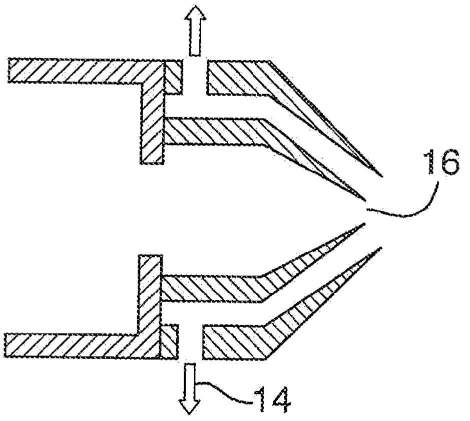

FIG. 2C shows another embodiment wherein an atmospheric pressure and sampling orifice 16 is provided or otherwise formed in a skimmer cone. An outer housing is provided which surrounds a skimmer cone and a pump 14 is used to increase the gas flow directly past the skimmer cone thereby increasing the capture efficiency of the atmospheric pressure and sampling orifice 16.

Figure 3A:
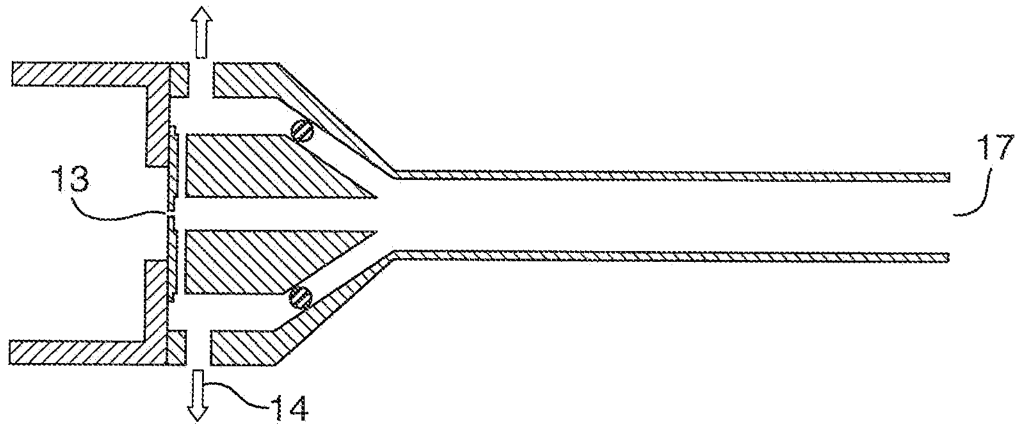
FIG. 3A shows an embodiment of the present invention wherein the outer housing further comprises a cylindrical tube in which ions formed at a distance by an on source (not shown) can be captured and transferred to the sampling zone of an atmospheric pressure orifice and FIG. 3B shows an embodiment of the present invention comprising a skimmer cone similar to that shown in FIG. 2C wherein the outer housing further comprises a cylindrical tube in which ions formed at a distance by an ion source (not shown) can be captured and transferred to the sampling zone of an atmospheric pressure orifice.

FIG. 3A shows another embodiment for improving the efficiency of sampling of ions formed at a distance by an ion source (not shown). This embodiment is similar to that shown in FIG. 2B except that the outer housing extends upstream of the inner housing to form a cylindrical tube or extension member having a sampling orifice 17. The pumping 14 creates a greater level of gas flow at the sampling orifice 17 to capture ions and transfer them to the atmospheric pressure orifice 13. The geometry of the outer cone tube (i.e., second housing) is preferably optimised for the application. The outer cone tube may also be heated to further aid desolvation of a sample gas passing therethrough.

An o-ring, seal or gas flow restriction device is preferably located in the annular volume between the first or inner housing and the outer cone (i.e. second housing). The o-ring, seal or gas flow restriction device preferably prevents all the gas going around the outside of the inner cone so that the gas is instead directed towards the atmospheric pressure orifice 13.

Figure 3B:
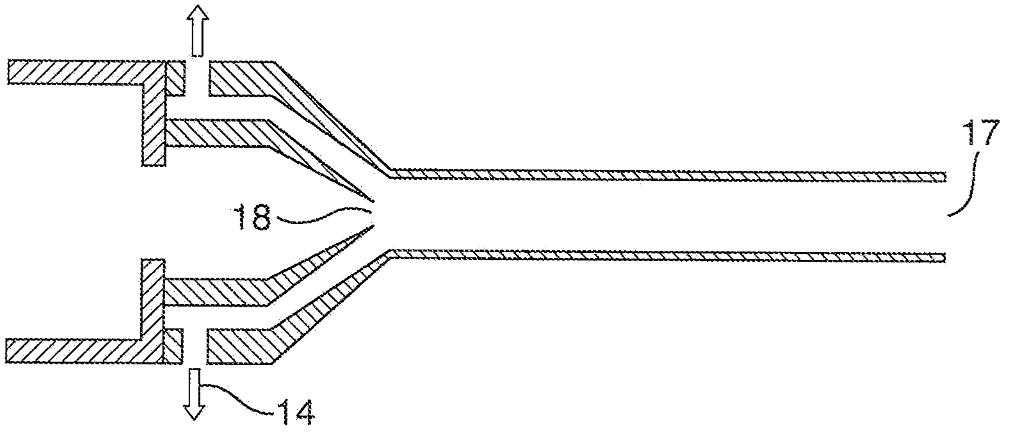

FIG. 3B also shows an embodiment for improving the efficiency of sampling of ions formed at a distance. This embodiment is similar to that shown in FIG. 2C except that the outer housing extends upstream of the atmospheric pressure orifice 16 to form a cylindrical tube or extension member having a sampling orifice 17.

Figure 4A:
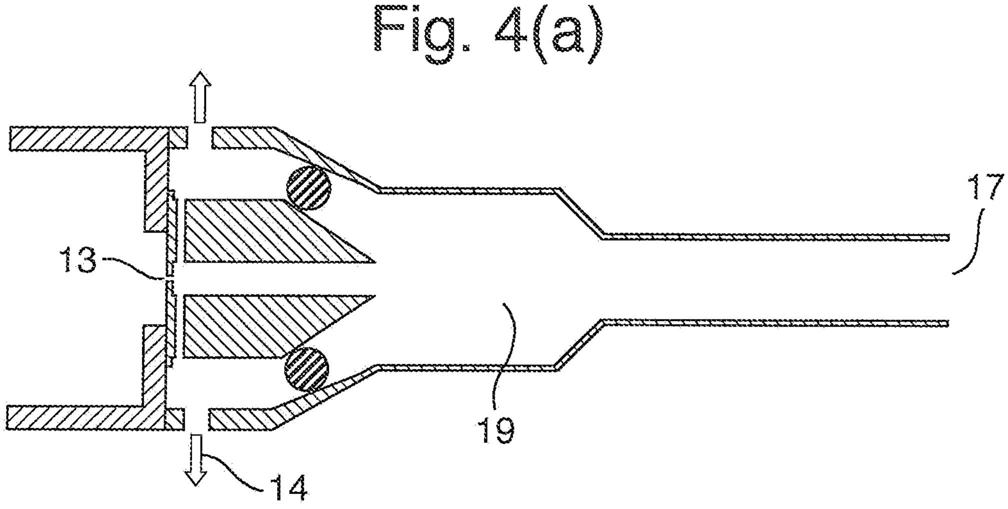
FIG. 4A shows an embodiment of the present invention wherein the outer housing further comprises an ionisation chamber wherein compounds of interest can be ionised and transferred towards an atmospheric pressure orifice and FIG. 4B shows an embodiment of the present invention wherein the outer housing comprises an ionisation chamber in which compounds of interest can be ionised and transferred towards the atmospheric pressure orifice.

FIG. 4A shows another embodiment to improve the transport of compounds to an ionisation chamber. This embodiment is similar to that shown in FIG. 3A except that the second outer housing includes an ionisation chamber comprising an ionisation device such as a corona pin 19. The cross-sectional area of the conduit through the second housing increases in a direction from its inlet opening (i.e. from sampling orifice 17) to the atmospheric pressure orifice 13. The embodiment shown in FIG. 4A is particularly suitable for the analysis of volatile organic compounds ("VOC"). According to this embodiment compounds are pumped into the ionisation chamber and are then ionised close to the first inner housing, for example, by Atmospheric Pressure Chemical Ionisation ("APCI"). Alternatively or additionally, other forms of ionisation technique may be used, such as Atmospheric Pressure Photo-Ionisation ("APR"), Extractive Electrospray Ionisation ("EESI") or combinations of these. The ionisation chamber and outer cone tube may be heated to aid desolvation.

An o-ring, seal or gas flow restriction device is preferably located in the annular volume between the first or inner housing and the outer cone (i.e. second housing). The o-ring, seal or gas flow restriction device preferably prevents all the gas going around the outside of the inner cone so that the gas is instead directed towards the atmospheric pressure orifice 13.

Figure 4B:
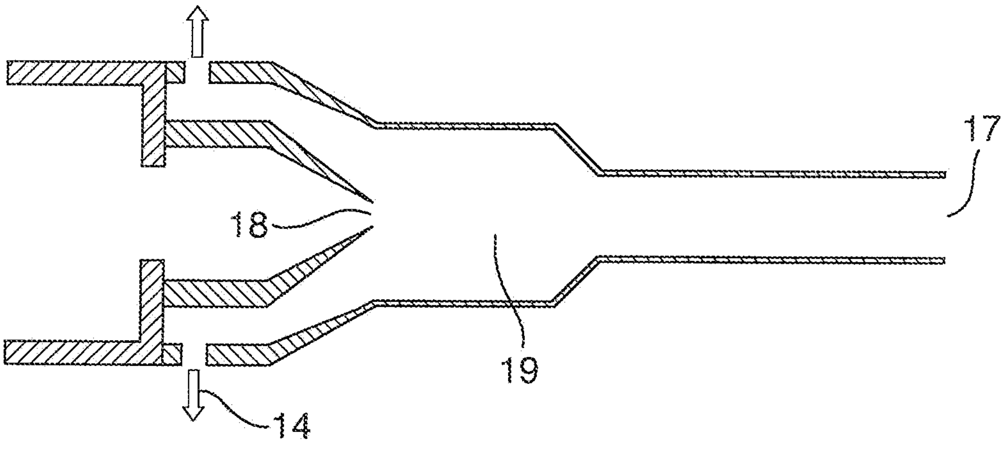

FIG. 4B shows an embodiment that is used in a similar way to that shown in FIG. 4A, except that a standard skimmer cone is utilised. This embodiment is similar to that shown in FIG. 3B except that the first housing includes an ionisation chamber comprising an ionisation means such as a corona pin 19. The cross-sectional area of the conduit through the housing increases in a direction from its inlet opening (i.e, sampling orifice 17) to the atmospheric pressure orifice 18 formed in the skimmer cone.

Figure 5:
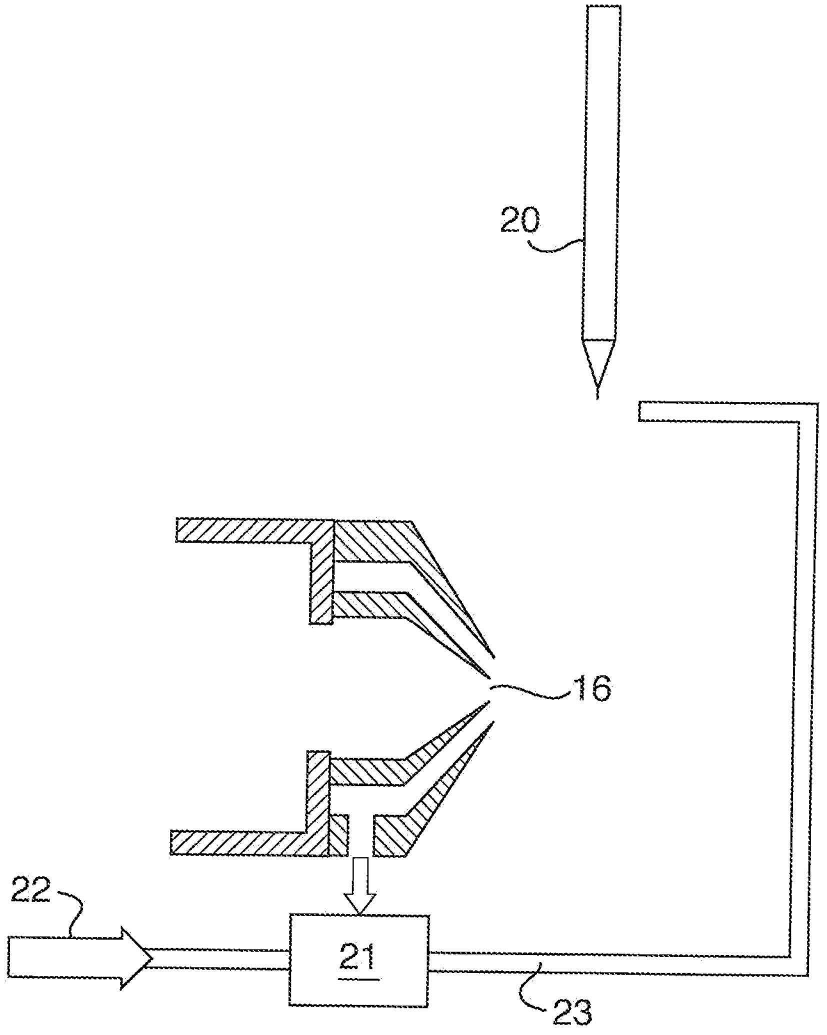
FIG. 5 shows how a venturi pump may be used in an Extractive Electrospray ("EESI") ion source to recycle gas back to the ion source for subsequent ionisation.

FIG. 5 shows an embodiment similar to FIG. 2C. A venturi pump 21 is used to pump gas 22 from a gas exit opening of a housing of an inlet such that the gas is recycled back into the spray emitted by an Electrospray Ionisation source ("ESP") via a venturi exhaust 23. As a result the gas is preferably ionised by the spray by Extractive Electrospray Ionisation ("EESI"). The ions created by this process then preferably enter the housing of the inlet and are transmitted through the atmospheric pressure and sampling orifice 16 into the mass spectrometer.

Other embodiments are also contemplated wherein the gas emitted or recycled by the venturi exhaust 23 is ionised by other types of ion source including an Atmospheric Pressure Chemical ionisation ("APCI") ion source, an Atmospheric Pressure Photo-Ionisation ("APPI") in source or any combination of these techniques to ionise the venturi exhaust.

Figure 6:
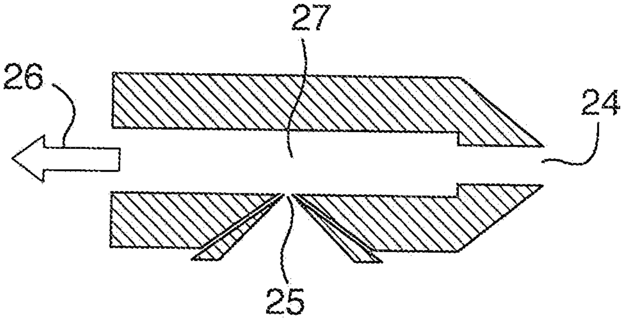
FIG. 6 shows a less preferred embodiment of the present invention wherein a relatively inexpensive and low performance pump may be used to reduce the gas load on the main pumping system of a mass spectrometer.

FIG. 6 shows a less preferred embodiment of the present invention wherein the pressure at a gas limiting orifice 25 of an inlet is at sub-atmospheric pressure. The sampling efficiency at a separate upstream sampling orifice 24 (which is preferably non gas limiting) preferably remains high, but the reduced pressure at the gas limiting orifice 25 reduces the overall gas load on the vacuum system. The pumping 26 used in this region does not need to be capable of backing a turbo pump and therefore can be much smaller and cheaper than those typically used in conventional mass spectrometers. The pressure in the chamber 27 is preferably in the range 100 mbar to atmospheric pressure.

Although various pumping systems have been described above, it is contemplated that a venturi pump, a diaphragm pump or other types of pump may be provided as the pumping mechanism. It is also contemplated that in conjunction with the pumping, potential differences may be applied between the housing(s) (e.g. the outer cone sections) and the atmospheric pressure orifice to aid transfer of ions through the atmospheric pressure orifice.

Although the present invention has been described with reference to preferred embodiments, it will be understood by those skilled in the art that various changes in form and detail may be made without departing from the scope of the invention as set forth in the accompanying claims.

The invention claimed is:

1. A mass spectrometer comprising:

a high pressure region and a low pressure region which are interconnected by an orifice, wherein the high pressure region is substantially at atmospheric pressure;

a housing arranged in the high pressure region and around the orifice, wherein the housing has an inlet in communication with the orifice such that components from a sample to be analysed may enter the housing from the high pressure region and then pass through the orifice into the low pressure region, and wherein the housing has an outlet opening in communication with the orifice; and means to draw gas from the high pressure region in through the inlet opening, towards the orifice and out of the outlet opening, wherein the means to draw gas draws the gas adjacent to and past the orifice and then out of the outlet opening, and wherein the gas drawn from the high pressure region contains the components;

wherein the inlet opening has a larger cross-sectional area than the orifice and is located a distance upstream of the orifice.

2. A mass spectrometer as claimed in claim 1 wherein said inlet opening is non-gas limiting.

3. A mass spectrometer as claimed in claim 1, wherein said inlet opening has a diameter or width selected from the group consisting of: (i) 0.1-1.0 mm; (ii) 1.0-2.0 mm; (iii) 2.0-3.0 mm; (iv) 3.0-4.0 mm; (v) 4.0-5.0 mm; (vi) 5.0-6.0 mm; (vii) 6.0-7.0 mm; (viii) 7.0-8.0 mm; (ix) 8.0-9.0; and (x) 9.0-10.0 mm.

4. A mass spectrometer as claimed in claim 1, wherein said inlet opening has a cross-sectional area selected from the group consisting of: (i) 0.007-1 $mm^2$; (ii) 1-10 $mm^2$; (iii) 10-20 $mm^2$; (iv) 20-30 $mm^2$; (v) 30-40 $mm^2$; (vi) 40-50 $mm^2$; (vii) 50-60 $mm^2$; (viii) 60-70 $mm^2$; (ix) 70-80 $mm^2$; (x) 80-90 $mm^2$; and (xi) 90-100 $mm^2$.

5. A mass spectrometer as claimed in claim 1, wherein said orifice is gas limiting.

6. A mass spectrometer as claimed in claim 1, wherein said orifice has a diameter or width selected from the group consisting of: (i) 0.05-0.5 mm; (ii) 0.5-1.0 mm; (iii) 1.0-1.5 mm; (iv) 1.5-2.0 mm; (v) 2.0-2.5 mm; and (vi) 2.5-3.0 mm.

7. A mass spectrometer as claimed in claim 1, wherein said orifice has a cross-sectional area selected from the group consisting of: (i) 0.001-1 $mm^2$; (ii) 1-2 $mm^2$; (iii) 2-3 $mm^2$; (iv) 3-4 $mm^2$; (v) 4-5 $mm^2$; (vi) 5-6 $mm^2$; (vii) 6-7 $mm^2$; (viii) 7-8 $mm^2$; (ix) 8-9 $mm^2$; and (x) 9-10 $mm^2$.

8. A mass spectrometer as claimed in claim 1, wherein said outlet opening comprises apertures in said housing adjacent said orifice.

9. A mass spectrometer as claimed in claim 1, wherein said housing comprises a first cone or inner portion.

10. A mass spectrometer as claimed in claim 9, wherein said inlet opening is provided in said first cone or inner portion.

11. A mass spectrometer as claimed in claim 9, wherein said outlet opening is provided in said first cone or inner portion.

12. A mass spectrometer as claimed in claim 9, wherein said housing further comprises a second cone or outer portion which surrounds said first cone or inner portion, wherein an annular volume is formed between said first cone or inner portion and said second cone or outer portion.

13. A mass spectrometer as claimed in claim 12, further comprising an o-ring, seal or gas flow restriction located in said annular volume.

14. A mass spectrometer as claimed in claim 13, wherein said o-ring, seal or gas flow restriction is arranged and adapted so that gas drawn into said inlet is drawn primarily towards said orifice.

15. A mass spectrometer as claimed in claim 13, wherein said o-ring, seal or gas flow restriction is arranged and adapted so that gas exiting said housing exits primarily through one or more gas outlets provided in said second cone or outer portion.

16. A mass spectrometer as claimed in claim 13, wherein said o-ring, seal or gas flow restriction is arranged and adapted to prevent or restrict gas flow between a portion of said annular volume and said inlet opening.

17. A mass spectrometer as claimed in claim 12, wherein said inlet opening is provided in said second cone or outer portion.

18. A mass spectrometer as claimed in claim 12, wherein said outlet opening is provided in said second cone or outer portion.

19. A mass spectrometer as claimed in claim 12, wherein said outlet opening comprises one or more gas outlets in said first cone or inner portion and further comprising one or more gas outlets in said second cone or outer portion which are in gaseous communication with the one or more gas outlets in said first cone or outer portion.

20. A mass spectrometer as claimed in claim 19, wherein, in use, gas is drawn: (i) into said first cone or inner portion; then (ii) out of said first cone or inner portion via the one or more gas outlets provided in said first cone or inner portion; then (iii) out of an annular volume between said first cone or inner portion and said second cone or outer portion via the one or more gas outlets provided in said second cone or outer portion.

21. A mass spectrometer as claimed in claim 12, wherein said first cone or inner portion or said second cone or outer portion farther comprises one or more cylindrical tubes or extension members.

22. A mass spectrometer as claimed in claim 21, wherein a cross-sectional area of said one or more cylindrical tubes or extension members varies along a length of said one or more cylindrical tubes or extension members.

23. A mass spectrometer as claimed in claim 22, wherein the cross-sectional area of said one or more cylindrical tubes or extension members increases along the length of said one or more cylindrical tubes or extension members from said inlet opening towards said orifice.

24. A mass spectrometer as claimed in claim 21, further comprising an ion source housed within said one or more cylindrical tubes or extension members.

25. A mass spectrometer as claimed in claim 24, wherein said ion source comprises a Glow Discharge ion source or a corona pin.

26. A mass spectrometer as claimed in claim 24, wherein said ion source comprises an Atmospheric Pressure Chemical Ionisation ion source.

27. A mass spectrometer as claimed in claim 21, wherein, in use, gas is drawn into said one or more cylindrical tubes or extension members and out of an annular volume between said first cone or inner portion and said second cone or outer portion via the one or more gas outlets provided in said second cone or outer portion.

28. A mass spectrometer as claimed in claim 12, further comprising a heating device arranged and adapted either: (i) to heat said first cone or inner portion; or (ii) to heat said second cone or outer portion; or (iii) to heat said one or more cylindrical tubes or extension members.

29. A mass spectrometer as claimed in claim 1, wherein either: (i) ions generated by an ion source are arranged to enter said housing via said inlet opening; or (ii) ions generated by an ion source are arranged to pass through said orifice.

30. A mass spectrometer as claimed in claim 1, wherein an axis through said inlet opening is substantially coaxial or otherwise parallel with an axis through said orifice.

31. A mass spectrometer as claimed in claim 1, wherein said means to draw gas comprises one or more pumps.

32. A mass spectrometer as claimed in claim 31, wherein said means to draw gas comprises a venturi or diaphragm pump.

33. A mass spectrometer as claimed in claim 1, wherein said low pressure region is a vacuum chamber.

34. A mass spectrometer as claimed in claim 1, further comprising an ion source for generating ions.

35. A mass spectrometer as claimed in claim 34, wherein said ion source is located upstream of said inlet opening.

36. A mass spectrometer as claimed in claim 34, further comprising a recycling device for recycling gas molecules which have exited said housing via said gas outlet back towards said ion source for subsequent ionisation of said gas molecules.

37. A mass spectrometer as claimed in claim 1, further comprising a device for maintaining a potential difference between at least a first portion of said housing and a second different portion of said housing either adjacent to or which defines said orifice so that ions are accelerated towards said orifice.

38. A method of mass spectrometry conducted with a mass spectrometer including a high pressure region and a low pressure region which are interconnected by an orifice, wherein the high pressure region is substantially at atmospheric pressure and a housing arranged in said high pressure region and around said orifice, wherein the housing has an inlet opening in communication with said orifice such that components from a sample to be analysed enter the housing from said high pressure region and then pass through said orifice into said low pressure region, and wherein said housing has an outlet opening in communication with said orifice, said method comprising:

drawing gas from said high pressure region in through said inlet opening, towards said orifice and out of said outlet opening, wherein the gas is drawn adjacent to and past the orifice and then out of the outlet opening, and wherein the gas drawn from the high pressure region contains the components;

wherein the inlet opening has a larger cross-sectional area than the orifice and is located a distance upstream of the orifice.

39. A mass spectrometer comprising:

a high pressure region and a low pressure region which are interconnected by an orifice;

a housing arranged in the high pressure region and around the orifice, wherein the housing has an inlet in communication with the orifice such that components from a sample to be analysed may enter the housing from the high pressure region and then pass through the orifice into the low pressure region, and wherein the housing has an outlet opening in communication with the orifice; and means to draw gas from the high pressure region in through the inlet opening, towards the orifice and out of the outlet opening, wherein the means to draw gas draws the gas adjacent to and past the orifice and then out of the outlet opening, and wherein the gas drawn from the high pressure region contains the components;

wherein the inlet opening has a larger cross-sectional area than the orifice and is located a distance upstream of the orifice; and wherein said housing is heated.

40. A method of mass spectrometry conducted with a mass spectrometer including a high pressure region and a low pressure region which are interconnected by an orifice and a housing arranged in said high pressure region and around said orifice, wherein the housing has an inlet opening in communication with said orifice such that components from a sample to be analysed enter the housing from said high pressure region and then pass through said orifice into said low pressure region, and wherein said housing has an outlet opening in communication with said orifice, said method comprising:

drawing gas from said high pressure region in through said inlet opening, towards said orifice and out of said outlet opening, wherein the gas is drawn adjacent to and past the orifice and then out of the outlet opening, and wherein the gas drawn from the high pressure region contains the components;

wherein the inlet opening has a larger cross-sectional area than the orifice and is located a distance upstream of the orifice, and wherein said housing is heated.

* * * * *